US00RE38579E1

(19) United States
(12) Reissued Patent
Gregoire

(10) Patent Number: US RE38,579 E
(45) Date of Reissued Patent: Sep. 14, 2004

(54) WIRING BOARD CONSTRUCTION AND METHODS OF MAKING SAME

(75) Inventor: George D. Gregoire, San Diego, CA (US)

(73) Assignee: Dimensional Circuits Corporation, San Diego, CA (US)

(21) Appl. No.: 10/032,285

(22) Filed: Dec. 20, 2001

Related U.S. Patent Documents

Reissue of:
(64) Patent No.: 6,005,198
Issued: Dec. 21, 1999
Appl. No.: 08/946,297
Filed: Oct. 7, 1997

(51) Int. Cl.[7] ..... H01R 9/09
(52) U.S. Cl. ..... 174/262; 174/266; 361/767; 439/82; 29/853; 427/97
(58) Field of Search ..... 174/262, 263, 174/266, 250; 29/852, 853; 427/97; 439/66, 82, 91; 361/767, 769, 771, 774, 776

(56) References Cited

U.S. PATENT DOCUMENTS 4,076,575 A * 2/1978 Chang ..... 156/656
5,231,751 A * 8/1993 Sachdev et al. ..... 29/852
5,487,218 A * 1/1996 Bhatt et al. ..... 29/852
5,662,987 A * 9/1997 Mizumoto et al. ..... 428/209
5,699,613 A * 12/1997 Chong et al. ..... 29/852
5,715,595 A * 2/1998 Kman et al. ..... 29/845
5,744,758 A * 4/1998 Takenouchi et al. ..... 174/255
5,840,402 A * 11/1998 Roberts et al. ..... 174/250

OTHER PUBLICATIONS

Clyde F. Coombs, Jr., "Printed Circuits Handbook", published by McGraw–Hill Copyright 1996.*

* cited by examiner

*Primary Examiner*—Dhiru Patel
(74) *Attorney, Agent, or Firm*—Duckor Spradling & Metzger; Bernard L. Kleinke

(57) ABSTRACT

A wiring board construction includes at least one microvia disposed in a base substrate and includes a deep imprinted cup shaped recess in the top surface thereof. A conductor material is disposed within the recess, and has a portion disposed at the bottom thereof. A conductor disposed at a bottom surface of the substrate opposite to the conductor material bottom portion helps to complete an electrically conductor path through the substrate to help complete an electrically conductive path through the substrate.

45 Claims, 3 Drawing Sheets

WIRING BOARD CONSTRUCTION AND METHODS OF MAKING SAME

Matter enclosed in heavy brackets [ ] appears in the original patent but forms no part of this reissue specification; matter printed in italics indicates the additions made by reissue.

CROSS-REFERENCE TO RELATED APPLICATIONS

Not applicable

STATEMENT REGARDING FEDERALLY SPONSORED RESEARCH OR DEVELOPMENT

Not applicable

REFERENCE TO A "MICROFICHE APPENDIX"

Not applicable

BACKGROUND OF THE INVENTION

1. Technical Field

The present invention relates in general to wiring board constructions and methods of making them. The invention more particularly relates to methods of making microvias in wiring boards.

2. Background Art

Plated through holes have been employed in printed wiring boards for establishing electrical connections between the top and bottom sides of the boards. Such plated through holes have also been employed in multiple layer wiring board constructions.

According to the construction of conventional plated through holes, relatively large pads surround the plated through holes according to conventional design techniques, because the plated through holes are created by drilling through the conductor pad and the board. The pad is electrically connected to a conductor trace, and the conventional pads are substantially larger in size than the trace to accommodate any potential layer-to-layer or pattern-to-hole misregistration problems during the construction of the plated through hole. As explained in the book, entitled "Printed Circuit Handbook", Fourth Edition, by Clyde F. Coombs, Jr., published by McGraw-Hill, the misregistration is caused principally by the instability and movement of the base laminate substrate during the process of making the printed wiring board or multilayer board.

By having the large pad surrounding the hole, an unwanted and undesirable waste of valuable space on the wiring board results. As stated in the Coombs book, a reduction in the pad diameter from 55 to 25 mils causing a 55% reduction in an area. Such a reduction would double the overall interconnection density. Thus, it is important to reduce the pad diameters. The reduction of the pad diameters would be highly desirable for increasing greatly the wiring capacity of the modern complex printed wiring boards.

Thus, it would be highly desirable to have a new and improved wiring board construction and method of making it to enable through holes to be provided with little or no surrounding pads.

Additionally, the forming of through holes by drilling through the pads individually is time consuming and expensive. Considering the fact that a large number of such through holes are required according to modern manufacturing techniques, it would be highly desirable to enable the individual drilling to be eliminated.

Therefore, the formation of through holes in printed wiring boards and multilayer boards in one operation without the necessity of drilling each one individually would be highly advantageous for cost saving and through put purposes. Also, it would be highly desirable to form the through holes in a highly precise manner to eliminate or greatly reduce the problem of misregistration.

SUMMARY OF THE INVENTION

Therefore, the principal object of the present invention is to provide a new and improved wiring board construction and method of making it, wherein microvias can be formed simultaneously without individual drilling and with little or no loss in valuable space on the wiring board, thereby to increase the wiring capacity for the board.

Briefly, the above and further objects of the present invention are realized by providing a new and improved wiring board and construction and method of making it to produce wiring board constructions having high density microvias formed without occupying unnecessary space on the board. Surrounding pads are either greatly reduced in size or entirely eliminated. Furthermore, the microvias are all able to be formed simultaneously, without the requirement of expensive individual drilling, and are formed at the same time as the traces on the board.

A wiring board construction includes at least one microvia disposed in a base substrate and includes a deep imprinted recess in the top surface thereof. A conductor material is disposed within the recess, and has a portion disposed at the bottom thereof. A conductor disposed at a bottom surface of the substrate opposite to the conductor material bottom portion helps to complete an electrically conductor path through the substrate to help complete an electrically conductive path through the substrate.

The conductive material can be supplied to the recess by electroplating, metal transfer and/or the addition of a microvia fill material. The substitute can be composed of an imprintable material including either an organic material such as reins and polymers, or an inorganic material such as ceramic material.

BRIEF DESCRIPTION OF DRAWINGS

The above mentioned and other objects and features of this invention and the manner of attaining them will become apparent, and the invention itself will be best understood by reference to the following description of the embodiments of the invention in conjunction with the accompanying drawings, wherein.

BEST MODE FOR CARRYING OUT THE INVENTION

Figure 1:
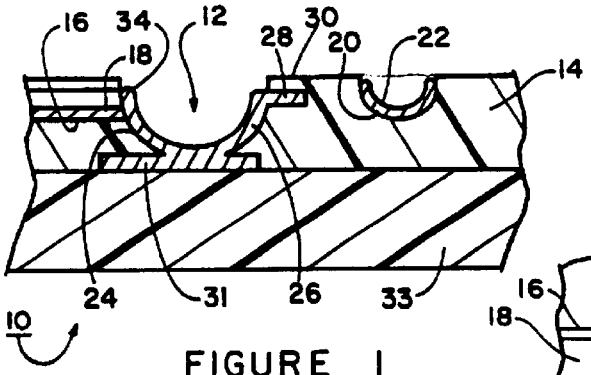
FIG. 1 is a sectional diagrammatic fragmentary elevational view of a wiring board construction, which is constructed in accordance with the present invention.
Figure 2:
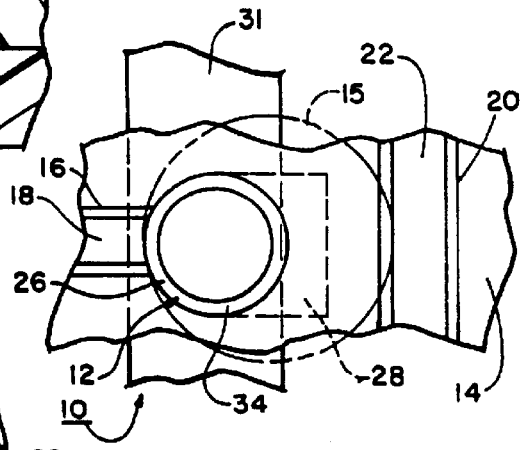
FIG. 2 is a fragmentary plan view of the board of FIG. 1.
Figure 1A:
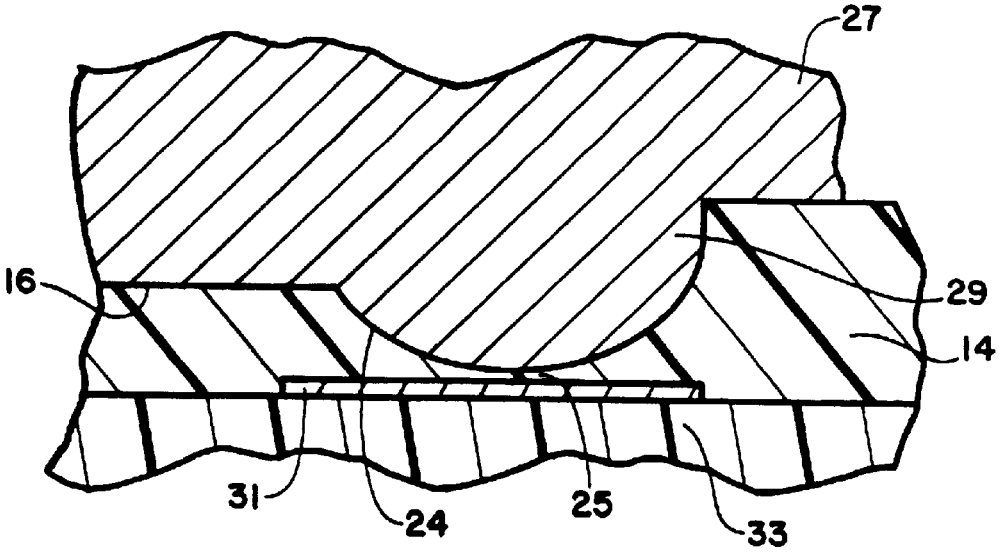
FIG. 1A is an enlarged sectional fragmentary diagrammatic elevational view of the wiring board construction of FIG. 1, illustrating it in the process of being fabricated.

Referring now to the drawings, and more particularly to FIGS. 1, 1A and 2 thereof, there is shown a wiring board construction 10, which is constructed in accordance with the present invention. The terms "wiring board" as used herein are intended to refer to and to include the terms "printed circuit board."

The wiring board construction 10 includes a microvia 12 formed in the wiring board construction 10 in accordance with the present invention. As seen in FIG. 2, the size of the microvia 12 is substantially smaller than the size of a conventional pad as indicated at 15 which would surround a conventional microvia (not shown), thereby greatly improving wiring density for the wiring board construction 10 as compared with conventional wiring densities.

A conductor shallow groove 16 has a conductor pad 18 or trace electrically connected to the microvia 12. The curved conductor trace 18 is formed in the top substrate 14 in accordance with fabrication methods disclosed in U.S. Pat. Nos. 5,334,279; 5,390,412 and 5,451,722, which are incorporated herein by reference. A conductor shallow groove 20 having a curved conductor pad 22 forming another trace in the wiring board construction 10 is also formed in the substrate 14 in accordance with the method disclosed in the foregoing patents. In accordance with the methods of the present invention, the microvia 12 and the conductor pads 18 and 22 are all formed simultaneously, and the microvia 12 does not require drilling.

Considering now the microvia 12 in greater detail, the microvia 12 includes a conductor deep recess 24 formed in the top surface of the substrate 14, and has a dished or cup shaped conductor 26 lining the surface of the groove 24. The conductor 26 is generally circular in cross section as indicated in FIG. 2, and includes a side flanged 28 for interconnecting with other conductors as hereinafter described in connection with FIG. 3 of the drawings. A conductor or trace 31 is disposed on the top surface of a bottom substrate 33 and is electrically connected to the bottom portion of the microvia conductor 26.

A rim 34 of the cup shaped conductor 26 is disposed substantially below the surface disposed between adjacent conductors 26 and 22 as indicated in FIG. 1. The solder dam 30 is a portion of the substrate 14 disposed above the top surfaces or rims of the conductors 22 and 26, such as the rim 34 to reduce solder bridging.

The conductor trace 31 can be a pad, which can be square, round or tear drop in configuration.

The microvia 12 is formed by imprint patterning to simultaneously form all of the interconnecting traces in both the X and Y directions (traces 18 and 22), as well as the Z direction (microvia 12).

Referring now to FIG. 1A, according to the method of the present invention, the wiring board construction 10 is made by using a low cost and repeated-use metal imprinting tool 27 to pattern the substrate 14 to form the grooves 16 and 22, and the recess 24, simultaneously. All of this is accomplished without requiring a phototool film, photoresist, imaging, developing or permanent solder mask (not shown).

The metal imprinting tool imprints the entire circuit and microvia pattern simultaneously by compression forming on one or both layers in a conventional printed wiring board laminating press (not shown) while the interlayers are being laminated. The patterning tool can be made by electroforming, an extremely reliable and inexpensive atom-by-atom electrodeposition process.

Considering now in greater detail the method of making the microvia 12 of the wiring board construction 10 in accordance with the present invention, the cup-shaped recess 24, as well as the U-shaped conductor grooves 16 and 20, are formed simultaneously in the top substrate 14 by imprinting or stamp forming by means of the tool 27 hot-pressed into the top surface of the substrate 14 utilizing the laminating press (not shown). The cup-shaped recess 24 is circular in cross section, and extends substantially through the entire depth of the substrate 14 and extends to the conductor 31 therebelow. Prior to metalizing the recess 24 and the grooves 20 and 24 (FIG. 1), a thin web 25 at the bottom of the recess 24, as best seen in FIG. 1A, is removed.

There are a variety of removal or ablation techniques, which are preferred in accordance with the present invention. For example, a wet-chemical attack can be used. In this regard, the side walls of the recess 24 are etched back before metalizing. Permanganate etchback may be employed, although other etchback materials may also be employed as will become apparent to those skilled in the art. In the case of a substrate which is composed of photosensitive material, a pass through the weakened or diluted developer solution is utilized to remove the web 25.

Another web removal process is performed by abrasive etching. A plurality of nozzles (not shown) disposed above the substrate 14 may be employed, or fluidized bed abrasive ablation. Another technique for web removal is the use of dry etching by use of plasma techniques. Such a technique is inherently clean, and the dry etching process can be performed non-selectively, without the use of a film or a mask. This technique is possible because the thickness of the web 25 to be removed at the bottom of the microvia 12 is dramatically thinner than the thickness of the entire layer. All areas can be slightly reduced in thickness without adversely altering the final X-Y configuration of the pattern definition.

A further web removal technique is to employ laser cutting techniques. Because the web 35 is very thin, rapid ablation of the web 25 is possible with low wattage lasers, depending upon the wave length used. However, laser ablation is a serial, or small area process, often somewhat slower than the alternatives.

A still further web-removal approach in accordance with the present invention is to employ heat ablation, especially of uncured film. A planar or line-source of heat such as a halogen lamp source (not shown), is positioned in a closely spaced manner to the uncured substrate material, which may be disposed on a moving conveyor (not shown). The thin web 25 is thus heated and reverts from a polymer to a monomer. Although this could also happen on the top surface, removal by a wet chemical method of a tiny portion of all surfaces preserves the pattern, thereby eliminating the need for registration and many other empirical steps otherwise employed in conventional techniques.

Yet another web removal technique according to the present invention is the use of scrubbing by vibration such as by the use of ultrasonic vibrations of the tool plate during or after lamination molding to cause the web 25 to be pushed aside by scrubbing.

An additional technique for web removal is to remove the webs by subjecting them simultaneously to a group of high pressure jets of fluid, such as air, nitrogen or other gases or liquids. Thus, the jets penetrate and break away the webs.

A further approach according to the present invention is to omit the web removal step entirely and replace it with a punch through operation, where a sharp pointed instrument (not shown) severs the web 33 without removing it entirely.

A further approach is to omit the web removal process entirely, and a metal conductor 31 on the surface of the tool and the metal cup-shaped conductor 26 are microwelded together through the thin web 25. In this regard, the conductors 26 and 31 on the surface of the tool have microscopic aspirites which cause a microwelding of the metals together and effectively penetrate the web 25.

In the situation where the web is removed, a blind hole (not shown) is formed in the web 25. Thus, the hole formed in the web 25 is bottomed at the conductor 31, and when the recess 24 is subsequently lined with the conductor 26, the microvia 12 results as indicated in FIG. 1.

After patterning the grooves and recesses as indicated in FIG. 1A, the laminate 14 is then metalized. One metalizing technique is to perform a metal transfer operation as disclosed in detail in U.S. Pat. Nos. 5,334,279; 5,390,412 and 5,451,722 incorporated herein by reference.

A further technique for applying metal material to the recesses is to coat the recesses with a conductive ink by means of a squeegee.

Another approach is to electroplate the patterned laminate 14. In such an approach, the conductors are added by applying a liquid, non-photoreactive etch resist is applied by a squeegee (not shown). A resist application requires no registration, because the resist enters the U-shaped grooves and the microvia recesses, precisely in position to shield interior metal from the subsequent etching process. After resist curing, all unprotected metal is removed in a conventional conveyorized etcher (not shown), leaving recessed metal in the pads and traces, as well as the conductor 26 of the microvia 12. Over etching is reduced or eliminated as a result of the present inventive techniques, since only the metal to be removed is exposed, so the etching process is substantially self terminating.

Self-registered dead-on solder dams, such as the solder dam 30, are readily formed between pads, and dam dimensions are precisely controllable according to the methods of the present invention.

Misregistration is reduced or totally eliminated, as all features are formed from the same pressure plate tool.

The substrates, such as the substrate 14 are composed of imprintable materials. The imprintable materials can either be organic or inorganic. The organic materials include resins and polymers. One example is a thermoset, sold under the tradename "HYSOL," made by the Hysol Aerospace Products Division of the Dexter Corporation, having a place of business at 2850 Willow Pass Road, Pittsburgh, Calif. 94563-0031. The "HYSOL" material is an imprintable, nipcast, highly filled, non-tacky laminate which is devoid of long glass fibers. Other organic imprintable materials include thermoplastics, psydosets or psydoplastics, such as polyimides.

Another organic material is an epoxy mold compound, which is a fast curing compound.

The substrates may also include inorganic imprintable materials, including green body technology referred to as "green tape," and ceramics, such as aluminum and beryllium oxide ceramics.

Figure 3:
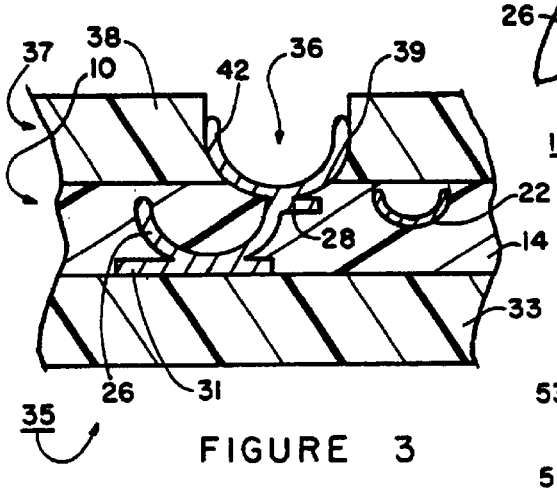
FIG. 3 is a fragmentary elevational sectional view of a multiple layer wiring board construction, including the wiring board construction of FIG. 1, according to the present invention.

Referring now to FIG. 3, there is shown a multiple layer wiring board construction 35 having a stair-step microvia 36, which is constructed in accordance with the present invention. The wiring board construction 35 comprises a top or first layer 37 overlying the wiring board construction 10 of FIGS. 1 and 2. A first or top substrate 38 of the layer 37 includes a top conductor recess 39 extending through the substrate 38. A cup-shaped conductor 42 lines the surface of the recess 39 in a similar manner as the conductor 26 lines its recess 24.

In order to form the stair-step microvia 36, the bottom portion of the conductor 42 engages electrically the flange 28 of the conductor 26 of the top substrate 14 of the wiring board construction 10. The multiple layer wiring board construction 35 is made according to the method as described in connection with the construction 10 of FIGS. 1, 1A and 2 of the drawings.

Figure 4:
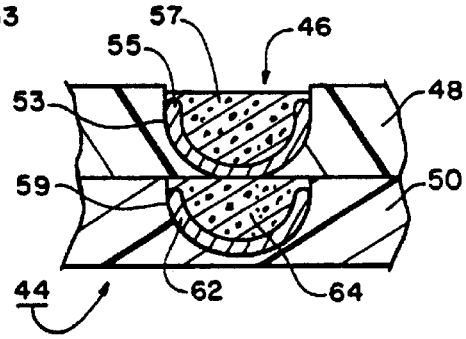
FIG. 4 is a sectional fragmentary elevational view of another multiple layer board construction, which is constructed in accordance with the present invention.

Referring now to FIG. 4, there is shown a multiple layer wiring board construction 44 having a microvia 46 therein, constructed in accordance with the present invention. The multiple layer wiring board construction 44 includes a first or top substrate 48 overlying a second or bottom substrate 50. A deep conductor recess 53 is disposed in the substrate 48 and has a cup-shaped conductor 55 lining the inner surface thereof. A microvia conductive fill material 57 fills the conductor lined recess 53. The recess 53 and the conductor 55 are formed in a similar manner as the respective cup shaped recess 24 and the conductor 26 of FIGS. 1 and 2.

Similarly, the substrate 50 includes a deep conductor cup shaped recess 59 disposed in alignment with the cup shaped recess 53, and has a cup shaped conductor 62 lining the inner surface thereof. The recess 59 is also filled with a microvia conductive fill material 64. The bottom surface of the upper conductor 53 engages electrically the conductive material 64 within the recess 59 to complete the microvia 46. Advantageously, microvia conductive fill material can be applied by squeegee into the horizontal (X_Y) traces at the same time the microvias are filled.

The construction 44 is made in a similar manner as the construction 10 of FIG. 1.

Figure 5:
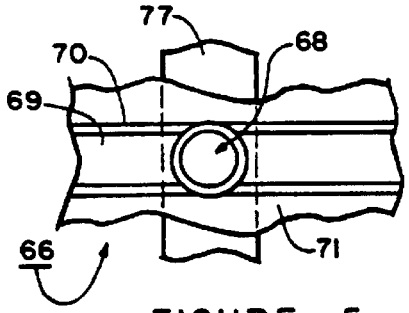
FIG. 5 is a fragmentary plan view of yet another wiring board construction, which is constructed in accordance with the present invention.
Figure 6:
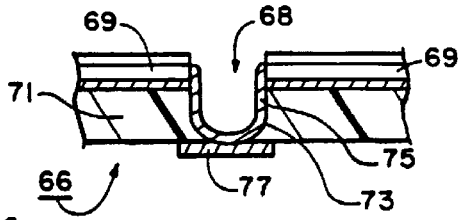
FIG. 6 is a sectional fragmentary elevational view of the wiring board construction of FIG. 5.

Referring now to FIGS. 5 and 6, there is shown a wiring board construction 66, which includes a microvia 68 disposed entirely within a curved conductor pad or trace 69 lining a conductor groove 70 within a substrate 71. Thus, in accordance with the present invention, the entire microvia 68 does not occupy any additional space on the substrate 71 beyond the trace 69.

The microvia 68 includes a deep conductor cross recess 73, which is cupshaped and is disposed entirely within the groove 77 of the top surface of the substrate 71. A cup-shaped conductor 75 lines the surface of the recess 73. A conductor 77 (FIG. 6) at the bottom surface of the substrate 71 is disposed in electrical contact with the bottom surface of the cup-shaped conductor 75 in a similar manner as the conductors 26 and 31 are disposed in FIG. 1. The construction 66 is made in accordance with the present invention in a similar manner as the method of making the construction 10 of FIG. 1.

Figure 7:
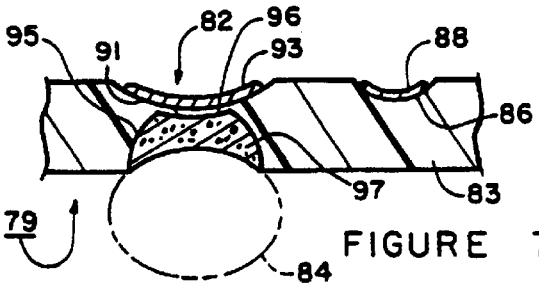
FIG. 7 is a sectional fragmentary elevational view of a wiring board construction, which is constructed in accordance with the present invention.

Referring now to FIG. 7, a ball grid ray construction 79 having a microvia 82 in a substrate 83 thereof is constructed in accordance with the present invention and is adapted to be connected electrically to a solder ball 84 at the bottom surface of the substrate 83. A conductor shallow U-shaped groove 86 in the top surface of the substrate 83 has a curved conductor pad or trace 88 lining the recess 86 and being disposed adjacent to the microvia 82.

The microvia 82 includes a shallow cup-shaped recess 91 having a shallow cup-shaped conductor 93 lining the surface thereof. A deep cup-shaped recess 95 in the underside of the substrate 83 is disposed in axial alignment with the recess 91 in the top surface of the substrate 83. The two recesses are separated by a thin, shallow cup-shaped or dished web 96. A microvia conductive fill material 97 is disposed within the bottom recess 95 and is connected electrically to the conductor 93 due to a microwelding through the web 96 due to aspirites on the conductor 93. In this regard, the aspirites penetrate the thin, shallow dished web 96 into electrical engagement with the conductive fill material 97 to complete the microvia 82.

The method of making the construction 79 is similar to the method of making the construction 10.

Figure 8:
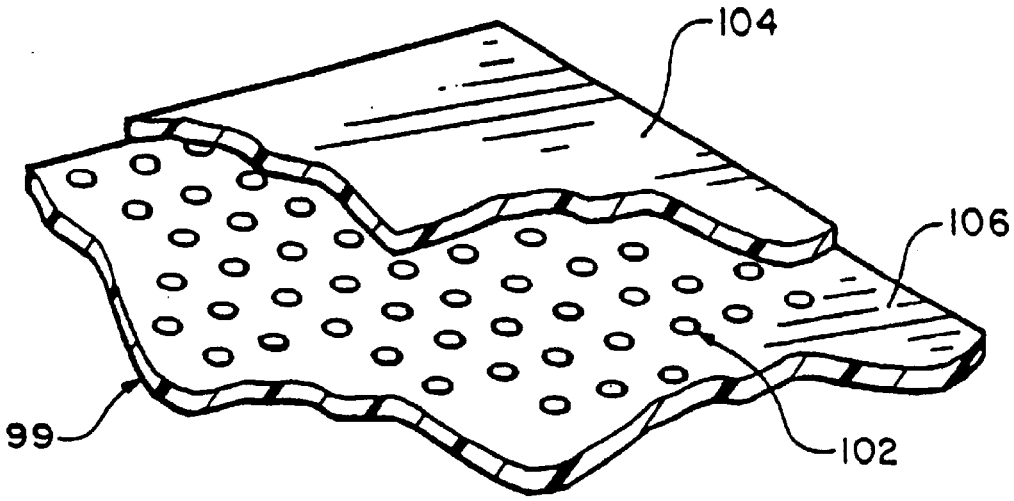
FIG. 8 is a fragmentary pictorial diagrammatic view of a standard grid pattern construction, which is constructed in accordance with the present invention.
Figure 9:
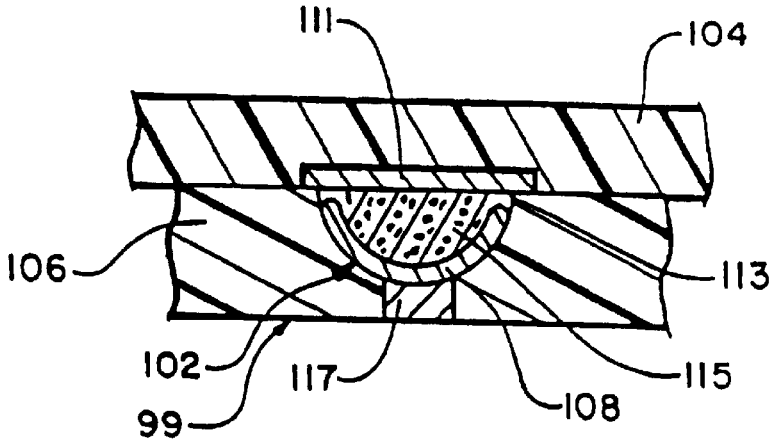
FIG. 9 is a fragmentary sectional elevational view of the construction of FIG. 8.

Referring now to FIGS. 8 and 9, there is shown a standard grid array 99 having a matrix 100 of microvias, such as a microvia 102. The standard grid ray 99 is disposed in underlying relationship relative to a top or first substrate 104. The matrix 100 of microvias is disposed in a second or bottom substrate 106 of the standard grid ray 99.

The microvias, such as the microvia 102 include a cup-shaped conductor 108 lining a hole or recess 113 in the top surface of the substrate 106. Microvia conductor fill material 115 fills the recess 113 and is disposed in electrical contact with a conductor 111 disposed in the bottom surface of the substrate 104.

A conductor 117 disposed on the underside of the bottom substrate 106 is disposed in electrical contact with the bottom surface of the cup-shaped conductor 108.

Figure 10:
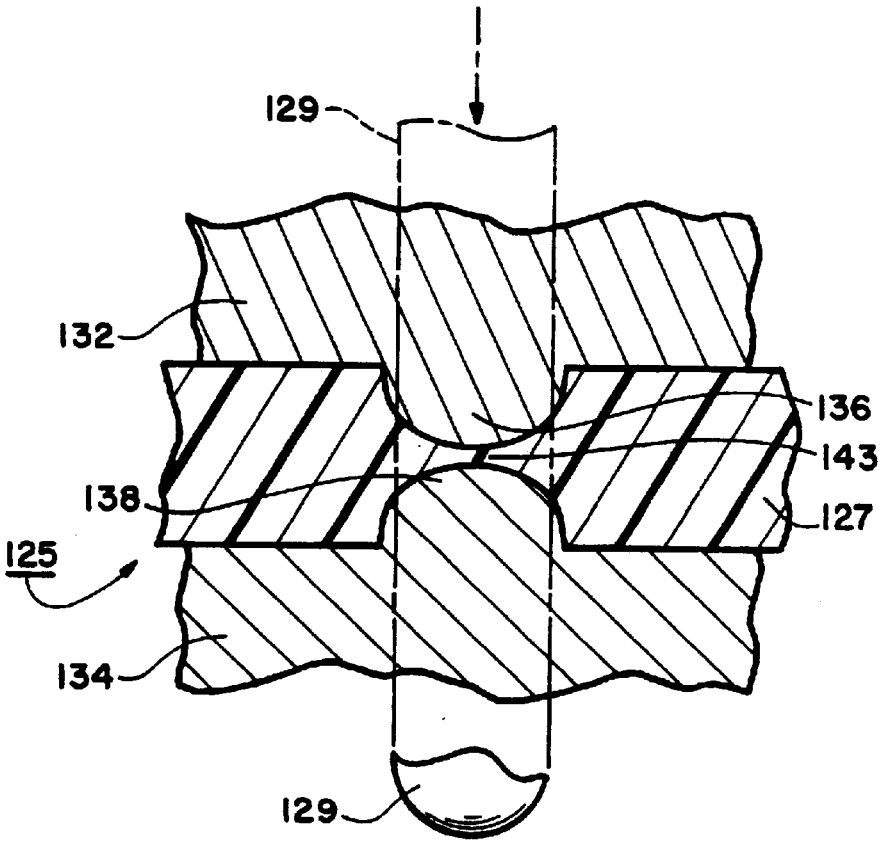
FIG. 10 is a sectional diagrammatic fragmentary elevational view of an interconnect carrier sheet illustrated in the process of being assembled in accordance with the present invention.

Referring now to FIG. 10, there is shown an interconnect carrier sheet 125, which is illustrated being constructed in accordance with the present invention. The sheet 125 includes a substrate 127, which is similar to the substrate 14 of FIG. 1. The interconnect sheet 125 has a group of interconnect devices mounted thereon. The devices include pins, such as the pin 129, and clips (not shown).

In order to fabricate the sheet 125, a pair of tools 132 and 134 having respective recess forming made members 136 and 138 imprint simultaneously a pair of deep cup-shaped circular recesses on the respective top and bottom surface of the substrate 127. The resulting recesses are axially aligned, and are separated by a thin substrate web 143. The web 143 may be removed by a variety of techniques, such as those techniques described in connection with the construction 10 of FIG. 1. Alternatively, the web 143 may be removed when the pin 129 is inserted into the recesses to secure it in place as indicated in phantom lines.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A wiring board construction, comprising:

a base substrate; and means defining at least one microvia being disposed in a top surface of said substrate and including a deep imprinted rounded cup shaped recess in the top surface thereof, said recess extending partially through said substrate, a conductor material being disposed within the recess, said material having a portion being disposed at a bottom portion of the recess, and a conductor disposed at a bottom surface of said substrate opposite to said conductor material disposed at the bottom portion of the recess; and said substrate having a thin readily penetrable rounded web defining the bottom portion of the recess to facilitate interconnecting electrically said conductor material and said conductor to complete an electrically conductive path through said substrate, said conductor material and said conductor having portions thereof extending through a bottom portion of said web to complete electrical contact between said conductor material and said conductor.

2. A wiring board construction according to claim 1, wherein said substrate is composed of an epoxy composition.

3. A wiring board construction according to claim 2, wherein said epoxy composition is "HYSOL."

4. A wiring board construction including at least one [Microvis] *microvia* therein made by a process comprising:

using a compressible substrate;

using a deep rounded cup shaped recess in a top surface of the substrate, the recess extending partially through the substrate and leaving a thin readily penetrable rounded web of substrate material at a bottom portion of the recess;

adding a cup shaped conductor material on at least a portion of the recess of the top surface, said conductor material including a portion being disposed at the bottom portion of the recess;

disposing a conductor at a bottom surface of said substrate opposite said conductor material disposed at the bottom portion of the recess to complete an electrically conductive path through said substrate to form a [Microvis] *microvia* in said substrate; and extending at least one of said conductor material and said conductor through a bottom portion of said web to complete electrical contact between said conductor material and said conductor.

5. A wiring board construction according to claim 4, wherein said conductor material includes electroplating.

6. A wiring board construction according to claim 4, wherein said conductor material includes transferring metal.

7. A multiple layer wiring board construction, comprising:

a top substrate;

a deep imprinted rounded cup-shaped recess in a top surface of said top substrate, the recess extending partially through the top substrate;

a thin readily penetrable web of substrate material defining a bottom portion of the recess;

conductor material disposed within the recess, said material having a portion being disposed at the bottom portion of the recess; [and]

a bottom substrate underlying a bottom surface of said top substrate and having an imprinted cup shaped recess therein and a cup-shaped conductor disposed therein near a top surface of said bottom substrate thereof opposite to the conductor material disposed at the bottom portion of the top substrate recess to complete an electrically conductive path through the top substrate; and wherein at least one *of* said conductor material and [of] said conductor have portions thereof extending through a bottom portion of said web to complete electrical contact between said conductor material and said conductor, thereby [forcing] *forming* a [Microvis] *microvia* through said substrates.

8. A multiple layer wiring board construction according to claim 7, wherein said conductor material and cup shaped conductor are electroplated.

9. A multiple layer wiring board construction according to claim 7, wherein said top and bottom substrates are each composed of thermoset material.

10. A method of making a multiple layer wiring board, comprising:

using a top substrate;

imprinting a deep rounded cup shaped recess in a top surface of said top substrate and extending partially through the top substrate to leave a thin readily penetrable web of substrate material at a bottom portion of the recess;

adding a cup shaped conductor material on a surface of said recess, said material having a portion being disposed at the bottom portion of the recess;

using a bottom substrate having a conductor disposed at a top surface thereof; [and]

disposing the bottom substrate in underlying relationship with a bottom surface of said top substrate, the conductor disposed at the top surface of the bottom substrate being positioned opposite to the conductor material disposed at the bottom of the recess to complete an electrically conductive path through said top substrate, thereby forming a [Microvis] *microvia* through said [and bottom] *top* substrate; and extending at least one of said conductor material and said conductor through a bottom portion of said web to complete electrical contact between said conductor material and said conductor.

11. A method according to claim 10, further including forming a deep imprinted cup shaped recess in the top surface of said bottom substrate;

disposing the bottom substrate conductor within the recess in said bottom substrate.

12. A method of making a multiple layer wiring board according to claim 11, further using a third substrate having a conductor, disposing the conductor of said third substrate in electrical contact with the conductor of the bottom substrate, thereby forming a [Microvis] *microvia* through said top and bottom substrates.

13. A method of making a multiple layer wiring board, according to claim 12, wherein said substrates are each composed of thermoset material.

14. A wiring board construction, comprising:

an imprintable substrate;

means defining a [shallow] groove in a top surface of said substrate;

a conductor disposed within said groove;

means defining a [Microvis] *microvia* being disposed substantially within said groove and connected electrically to [its] a pad, and including a [deep imprinted rounded cup shaped] recess disposed entirely within said groove, the recess extending partially through the substrate;

a thin readily penetrable web composed of substrate material defining a bottom portion of the recess;

imprinted conductor material lining at least a portion of said recess, said material being disposed at the bottom of the recess portion; [and]

a conductor disposed at a bottom surface of said substrate opposite to said conductor material disposed at the bottom of the recess bottom portion to complete an electrically conductive path through said substrate; and wherein at least one *of* said conductor material and said conductor have portions thereof extending through the bottom portion of said web to complete electrical contact between said conductor material and said conductor.

15. A wiring board construction according to claim 14, wherein said substrate is composed of an epoxy material.

16. A wiring board construction according to claim 15, wherein said epoxy material is thermoset material.

17. A wiring board construction according to claim 14, wherein said substrate includes a material selected from the [material] *group* consisting of resins, polymers, thermosets, thermoplastics, psyclosets, psycloplastics, green body technology and ceramics.

18. A method of making a wiring board construction, comprising:

forming a [shallow] groove in a top surface of a substrate;

disposing a conductor within said groove;

imprinting a [deep rounded cup-shaped] recess within said groove and extending partially through the substrate to leave a thin readily penetrable web of substrate material at a bottom portion of the recess;

lining at least a portion of said recess with conductor material, said material being disposed at the bottom portion of the recess; [and]

disposing a conductor at a bottom surface of said substrate opposite to said conductor material disposed at the bottom portion of the recess to [help] complete an electrically conductive path through said substrate; and extending at least one of said conductor material and said conductor through a bottom portion of said web to complete electrical contact between said conductor material and said conductor.

19. A standard grid array construction, comprising:

a first substrate;

a conductor pad disposed at a bottom surface of said first substrate;

a second substrate underlying said first substrate;

means defining a [Microvis] *recess* being disposed substantially within said second substrate, the [Microvis] *recess* further including [an imprinted rounded cup-shaped] *a* recess with a conductor lining, a thin readily penetrable web composed of second substrate material defining a bottom portion of the recess; and a third substrate underlying said second substrate, said third substrate having a conductor connected electrically to the [Microvis] *recess* within said first and second substrates and to the conductor pad of the first substrate.

20. A ball grid array, comprising:

a substrate;

a top [shallow rounded cup shaped] recess in [a] *an* upper surface of said substrate;

a conductor lining said [shallow rounded cup shaped] *top* recess;

a bottom [deep rounded cup-shaped] recess in a bottom surface of said substrate axially aligned with said top [shallow rounded cup shaped] recess; [and]

conductive means of filling said [deep] *bottom* recess; and a thin [shallow] *readily* penetrable [rounded cup-shaped] web composed of substrate material separating said [shallow rounded cup-shaped] *top* recess from said [deep] *bottom* recess.

21. A ball grid array according to claim 20, wherein said conductive means is conductive microvia fill material.

22. An interconnect carrier sheet, comprising:

a base substrate;

a top [deep rounded cup-shaped imprinted] recess, in a top surface of said substrate;

a bottom [deep rounded cup-shaped imprinted] recess axially aligned with [a] *said* top recess in a bottom surface of said substrate;

a thin [shallow] readily penetrable web composed of substrate material separating said top recess from said bottom recess; and an interconnect device disposed within the recesses and penetrating said web composed of substrate material.

23. A method of making an interconnect carrier sheet for receiving and supporting a group of interconnect devices, comprising:

using a base substrate;

imprinting a top [deep rounded cup-shaped] recess in a top surface of the said substrate;

imprinting a bottom [deep rounded cup-shaped] recess in the bottom surface of said substrate; and inserting an interconnect device within the *top and bottom* recesses; [and]

wherein the top recess and the bottom recess are separated by a thin readily penetrable web composed of substrate material [after imprinting].

24. A method according to claim 23, wherein said interconnect device is a pin, said pin being inserted to penetrate the web interposed between the *top and bottom* recesses.

*25. A wiring board construction, comprising:*

*a base substrate having a top surface and a bottom surface;*

*a recess formed on said top surface of said base substrate, said recess having a bottom portion; and*

*a readily penetrable web of base substrate material being formed between said bottom portion of said recess and said bottom surface of said base substrate.*

*26. The wiring board construction according to claim 25, wherein said web comprises a penetrated portion adapted to allow communication between said bottom portion of said recess and said bottom surface of said base substrate.*

*27. The wiring board construction according to claim 25, further comprising a conductor material disposed on a surface of said recess.*

*28. The wiring board construction according to claim 27, further comprising a conductor disposed on said bottom surface of said base substrate.*

*29. The wiring board construction according to claim 28, wherein said web comprises a penetrated portion, said penetrated portion comprising an electrical connection between said conductor material and said conductor.*

*30. The wiring board construction according to claim 25, further comprising a conductor disposed on said bottom surface of said base substrate.*

*31. The wiring board construction according to claim 25, wherein said web is electrically penetrable.*

*32. A wiring board construction according to claim 25, wherein said substrate is composed of an epoxy composition.*

*33. A wiring board construction according to claim 32, wherein said epoxy composition is "HYSOL."*

*34. A wiring board construction including at least one microvia therein made by a process comprising:*

*forming a recess in a top surface of a compressible substrate, the recess extending partially through the substrate and leaving a readily penetrable web of substrate material between a bottom portion of the recess and a bottom surface of the substrate;*

*disposing a conductor material on at least a portion of the recess, said portion including the bottom portion of the recess; and*

*disposing a conductor on the bottom surface of said substrate in an aligned configuration with the bottom portion of the recess.*

*35. The wiring board construction according to claim 34, further comprising:*

*extending at least one of said conductor material and said conductor through said web to complete a conductive path between said conductor material and said conductor.*

*36. A wiring board construction according to claim 34, wherein said disposing a conductor material includes electroplating.*

*37. A wiring board construction according to claim 34, wherein said disposing a conductor material includes transferring metal.*

*38. A multiple layer wiring board construction, comprising:*

*a top substrate having a top surface and a bottom surface, said top surface having a first recess formed thereon, said first recess extending partially through said top substrate;*

*a readily penetrable web of substrate material formed between a bottom portion of said first recess and said bottom surface of said top substrate;*

*a conductor material disposed at least upon said bottom portion of said first recess; and*

*a bottom substrate underlying a bottom surface of said top substrate and having a second recess formed thereon and a conductor disposed substantially on a top surface of said bottom substrate, said conductor being aligned with said bottom portion of said first recess.*

*39. The multiple layer wiring board construction according to claim 38, wherein at least one of said conductor material and said conductor have portions thereof extending through said web to complete a conductive path between said conductor material and said conductor, thereby forming a microvia through said top substrate.*

*40. A multiple layer wiring board construction according to claim 38, wherein said conductor material and said conductor are electroplated.*

*41. A multiple layer wiring board construction according to claim 38, wherein said top and bottom substrates are each composed of thermoset material.*

*42. A method of making a multiple layer wiring board, comprising:*

*imprinting a recess in a top surface of a top substrate, said recess extending partially through the top substrate to leave a readily penetrable web of substrate material at a bottom portion of the first recess;*

*adding a conductor material on at least said bottom portion of said recess;*

*disposing a bottom substrate in underlying relationship with a bottom surface of said top substrate, said bottom substrate having a conductor disposed on a top surface thereof, the conductor being aligned with said bottom portion of the recess.*

*43. The method according to claim 42, further comprising:*

*extending at least one of said conductor material and said conductor through said web to complete a conductive path between said conductor material and said conductor.*

*44. A method according to claim 42, further comprising:*

*forming a recess in the top surface of said bottom substrate;*

*disposing the conductor within the recess in said bottom substrate.*

*45. A method of making a multiple layer wiring board according to claim 42, further comprising:*

*disposing a third substrate having a conductor, the conductor of said third substrate being in electrical contact with the conductor of the bottom substrate, thereby forming a microvia through said top and bottom substrates.*

* * * * *